United States Patent [19]

dePuglia et al.

[11] 4,429,559

[45] Feb. 7, 1984

[54] STRIP PROCESSING APPARATUS

[76] Inventors: Gaston D. dePuglia, 13 Seascape Ct., Brookings, Oreg. 97415; Greg A. Huber, 1701 Fortune Dr., Unit L, San Jose, Calif. 95131

[21] Appl. No.: 342,629

[22] Filed: Jan. 26, 1982

[51] Int. Cl.³ .............................................. B21D 43/00
[52] U.S. Cl. ........................................ 72/186; 29/563; 29/564; 29/566.3; 72/190; 83/326
[58] Field of Search ................. 29/564.6, 564.7, 566.1, 29/566.3; 72/190, 186, 406, 187, 184; 29/827; 83/326, 300, 303

[56] References Cited

U.S. PATENT DOCUMENTS

| | | | |
|---|---|---|---|
| 2,262,988 | 11/1941 | Brown et al. | 83/303 |
| 3,064,694 | 11/1962 | Brook et al. | 72/187 |
| 3,556,166 | 1/1971 | Whitney | 72/190 |
| 3,848,316 | 11/1974 | Bakermans et al. | 29/564.6 |
| 4,012,932 | 3/1977 | Gewiss | 72/187 |
| 4,362,039 | 12/1982 | Toti | 72/186 |

*Primary Examiner*—William R. Briggs
*Assistant Examiner*—Lawrence Meier
*Attorney, Agent, or Firm*—Warren M. Becker

[57] ABSTRACT

A recirculating strip processing apparatus is described comprising a recirculating stripper chain, a recirculating tool chain, a recirculating carrier follower chain and a recirculating die chain in a removable cassette for continuous processing of integrated circuit packages and leadframes. The processes described include deflashing an integrated circuit package, removal of the dam bar from the leadframe and cutting and bending the leads of the individual integrated circuit packages. When repair or replacement is required, the cassette involved is simply removed from the apparatus and replaced by another cassette thereby minimizing "down time" of the apparatus.

22 Claims, 10 Drawing Figures

STRIP PROCESSING APPARATUS

BACKGROUND OF THE INVENTION

The present invention relates to strip processing apparatus in general and in particular to recirculating strip processing apparatus for processing a strip of integrated circuit packages and the leadframe associated therewith.

In the course of processing a strip of integrated circuit packages and the leadframe associated therewith, it is generally necessary to perform three processing steps. The three processing steps include deflashing the packages which comprises the removal of excess plastic material formed during molding of the packages which extends from the integrated circuit package to the interior of a leadframe dam bar; dam bar removal, which comprises removing from the leadframe a strip of metal, called a dam bar, used for restricting the flow of plastic during the molding of the integrated circuit package to the leadframe; and lead cutting and bending, which comprises cutting the leads of the leadframe associated with individual integrated circuit packages and bending them to a predetermined position.

Heretofore, the above-described steps of processing a strip of semiconductor packages and their associated leadframe have involved the use of apparatus for cutting and bending the selected parts of the packages and leadframe using conventional reciprocating and/or stamping apparatus.

A principal disadvantage of the conventional reciprocating and stamping apparatus is that their speed of operation is limited by what is called the "floating or spring effect." This effect increases as the speed of operation increases. It is a consequence of the inertia of the moving parts and spring characteristics and members associated therewith. The magnitude of these factors in the apparatus determines the time it takes to change the direction of motion of the moving parts in the apparatus.

Another disadvantage of the prior known reciprocating and stamping apparatus is called the "hammer effect." The "hammer effect" results from the pounding caused by the moving tool assemblies of the apparatus striking the fixed, die assemblies of the apparatus. The vibration caused by the hammer effect has a deleterious effect on delicate electronic circuitry in the packages being processed and results in rapid wearing of the impacting parts. Both the floating and hammer effects tend to limit yield and result in high maintenance costs.

Precise alignment of the tool and die assemblies of the apparatus is also essential in conventional strip processing apparatus. This typically requires the use of expert mechinists to assemble and disassemble the apparatus for maintenance and operation. Unless the tool and die assemblies of the apparatus are accurately aligned, the parts being processed will be defective and the apparatus itself will be subject to increased maintenance.

Still another disadvantage of the prior known apparatus is that it tends to be noisy due to the hammer effect caused by the pounding of the tool and die assemblies as they come together during the cutting and bending portions of the strip processing. It is well known that excessive noise levels have an adverse effect on operators and significantly reduce their effectiveness as well as being dangerous to their health.

SUMMARY OF THE INVENTION

In view of the foregoing, a principal object of the present invention is a strip processing apparatus comprising recirculating tool and die assemblies.

Another object of the present invention is a strip processing apparatus as described above comprising a plurality of recirculating tool and die assemblies for continuous processing of integrated circuit packages and the leadframe associated therewith.

Still another object of the present invention is a strip processing apparatus as described above comprising a plurality of removable cassette processing stations. Each of the processing stations comprises recirculating tool and die assemblies for performing one or more of a plurality of processing steps involved in processing a strip of integrated circuit packages and the leadframe associated therewith.

With the removable cassette recirculating tool and die assemblies according to the present invention, floating effects, hammer effects, the need for expert personnel to assemble and align the tool and die assemblies, the noise associated with the prior known conventional processing apparatus and "down time" for maintenance are substantially reduced, resulting in higher yields, greater throughput, less down time and consequently reduced maintenance and manufacturing costs.

In operation, a strip of material, such as semiconductor packages with their associated leadframe, is fed continuously into one end of the apparatus. As the strip passes through each station in the apparatus, the several processing steps are accomplished on a continuous basis. At the end of the processing steps, the devices, if not previously separated, are severed from each other and made available for placement in transporting containers for further processing and/or testing prior to shipment to a customer.

BRIEF DESCRIPTION OF DRAWING

The above and other objects, features and advantages of the present invention will become apparent from the following detailed description of the accompanying drawings in which.

DETAILED DESCRIPTION OF THE DRAWING

Figure 1:
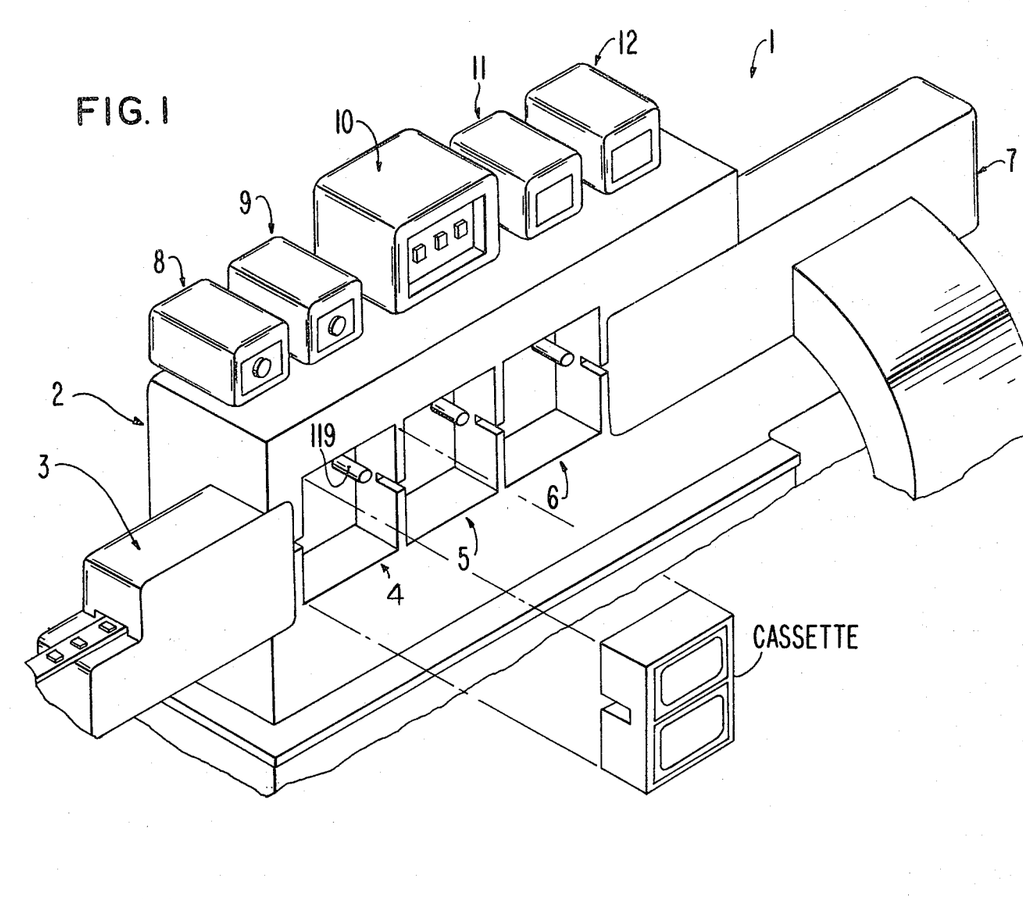
FIG. 1 is a perspective view of a three-station cassette strip processing apparatus according to the present invention.

Referring to FIG. 1, there is disclosed a three-station integrated circuit package strip processing apparatus according to the present invention, designated generally as 1. In the apparatus 1 there is provided a housing 2. In the housing 2 there is provided an input station 3, a first removable cassette strip processing station 4, a second removable cassette strip processing station 5, a third removable cassette strip processing station 6 and an output station 7. The cassette in station 4 is shown removed therefrom to show how the cassette fits in the housing 2. On the top of the housing 2 there is provided a plurality of control assemblies including a starting control assembly 8, a stopping control assembly 9, a machine speed-control assembly 10, an output real elapsed time counter 11 and an output rate counter 12. These assemblies, forming no part of the present invention, are not further described herein.

In the input station 3 there is provided means (not shown and forming no part of the present invention) for aligning and entering the integrated circuit package and strip being processed into the first processing station 4. From the first processing station 4, the strip is fed automatically to the second processing station 5 and thereafter to the third processing station 6. From the third processing station 6, the processed strip is fed to the output section 7 wherein the individual semiconductor packages, if not previously separated, are separated from the leadframe and placed in a carrier for transporting the processed packages to another apparatus for further processing and/or testing prior to shipment to a customer.

The details of the input and output stations 3 and 7, forming no part of the present invention, are not further described herein.

Each of the processing stations 4, 5 and 6 perform different processing steps. Typically, station 4 performs a processing step called deflashing. Deflashing comprises removal of excess plastic formed on the integrated circuit package during the molding thereof to the leadframe, which extends from the integrated circuit package to a dam bar adjacent to the package. Station 5 performs the processing step of removing the dam bar. Processing station 6 performs the processing steps of severing the ends of the integrated circuit package leads from the remainder of the leadframe and bending the leads in such a fashion that the leads can be subsequently mounted in a socket, soldered or otherwise connected to other components in an electronic circuit assembly.

Except for the specific tool used for accomplishing the individual processing steps in each of the processing stations 4, 5 and 6, each of the stations 4, 5 and 6 are substantially identical and therefore only one of the processing stations—namely, station 4—will be described in detail below. However, it will be apparent to those skilled in the art from the following detailed description of station 4, how the tool and die assemblies in stations 5 and 6 are arranged to accomplish their specific strip processing functions.

Figure 2:
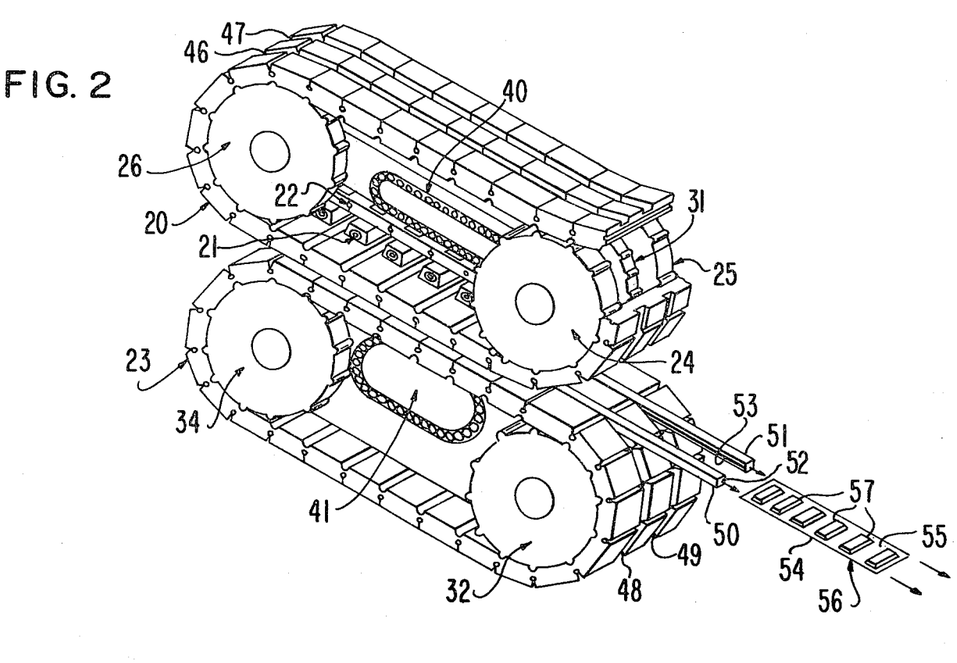
FIG. 2 is a partial perspective view of a strip processing cassette according to the present invention.
Figure 3:
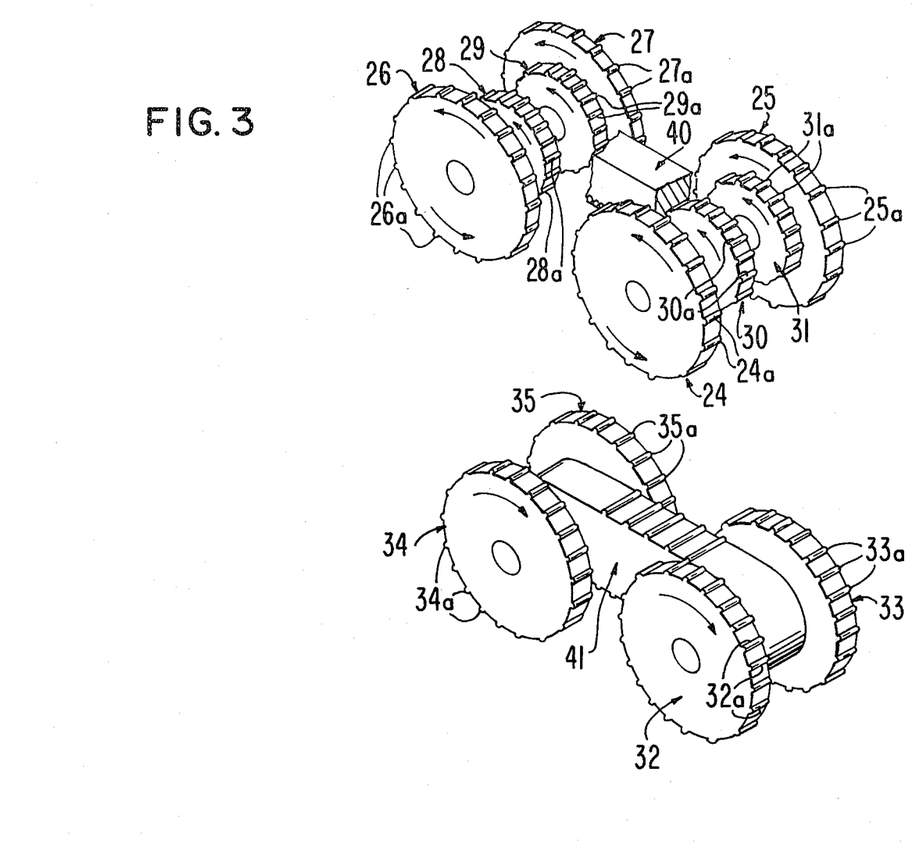
FIG. 3 is a perspective view of the drive wheels and bridges of the cassette of FIG. 2.

Referring to FIGS. 2 and 3, there is provided in accordance with the present invention a plurality of stripping members forming an endless stripping chain 20, a plurality of tool members forming an endless tool chain 21, a plurality of roller follower members forming an endless follower chain 22, and a plurality of die members forming an endless die chain 23.

To drive the stripping chain 20 in a recirculating fashion there is provided a pair of drive wheels 24 and 25 having chain-engaging teeth 24a and 25a, respectively, and a pair of idler wheels 26 and 27 having chain-engaging teeth 26a and 27a, respectively. To rotate the chains 21 and 22 in a recirculating fashion there is provided a pair of drive wheels 28 and 29 having chain-engaging teeth 28a and 29a, respectively, and a pair of idler wheels 30 and 31 having chain-engaging teeth 30a and 31a, respectively. To drive the chain 23 in a recirculating fashion there is provided a pair of drive wheels 32 and 33 having chain-engaging teeth 32a and 33a, respectively, and a pair of idler wheels 34 and 35 having chain-engaging teeth 34a and 35a, respectively. All of the teeth described are generally rounded and equidistantly spaced about the periphery of their associated wheels.

Located between the stripping chain drive wheels 24 and 25 and the idler wheels 26 and 27 there is provided a recirculating bridge assembly 40. Located between the die chain drive wheels 32 and 33 and the idler wheels 34 and 35 there is provided a second recirculating bridge assembly 41.

As will be described below with respect to FIG. 5, each of the chains 20, 21 and 23 are interconnected using a plurality of pin members and a plurality of linking members for linking the individual members of the chains in a bicycle chain type fashion. The tool chain 22 is formed using pin members for coupling each of the tool members thereof to a corresponding one of the members in the stripping chain 21.

In the exterior surface of the chains 20 and 23 there is provided a plurality of recesses 46, 47, 48 and 49. Recesses 46–49 are provided for receiving a plurality of leadframe guide members 50 and 51. In the leadframe guide members 50 and 51 there is provided a pair of slots 52 and 53. Slots 52 and 53 are provided for slidably receiving a pair of edges 54 and 55 of a strip of integrated circuit leadframe 56 to which is mounted a plurality of integrated circuit packages 57.

Figure 4:
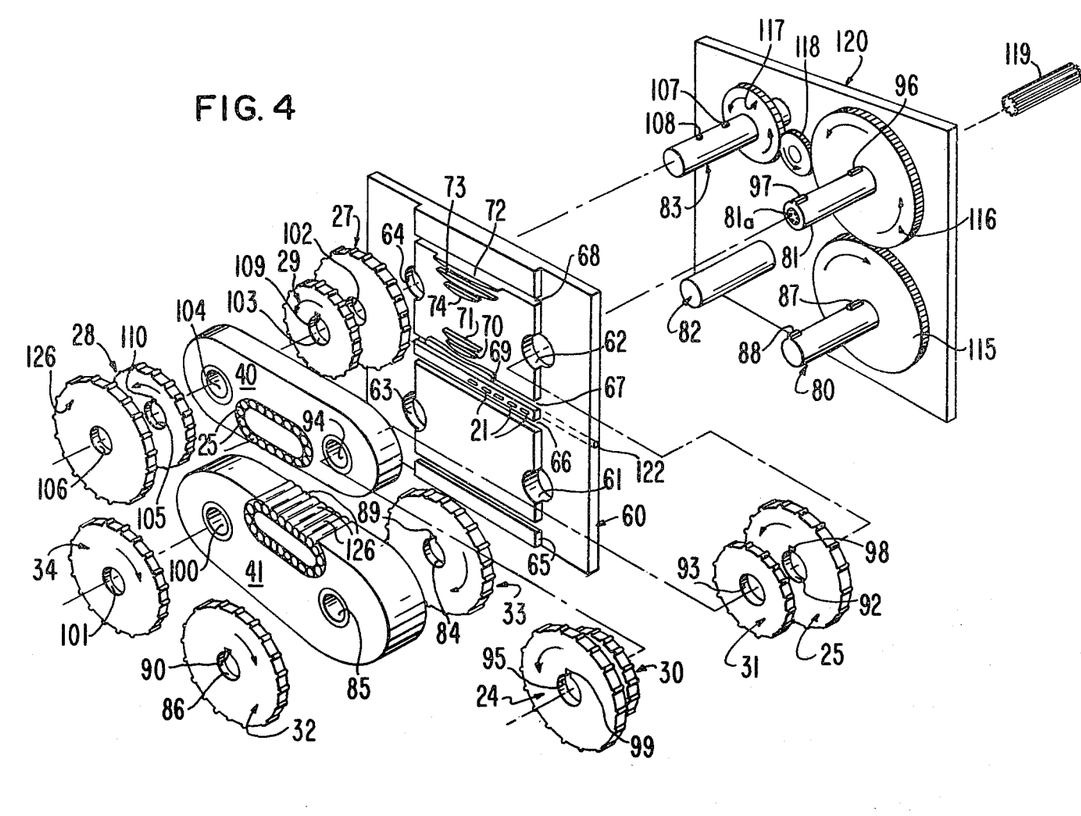
FIG. 4 is a perspective exploded view of the apparatus of FIG. 2 with its associated drive shaft and gear assembly and rear chain track plate. An associated front chain track plate is omitted for clarity.

Referring to FIG. 4, there is further provided in accordance with the present invention a rear track plate 60 and a front track plate (not shown) having corresponding features is also provided. In the plate 60 there is provided a plurality of holes 61, 62, 63 and 64. Extending across the central portion of the plate 60, below the holes 61 and 63, there is provided a lower die-chain-guiding slot 65. Above the holes 61 and 63, and parallel with the slot 65 there is provided a corresponding upper die-chain-guiding slot 66. Above the slot 66 and parallel therewith there is provided a lower stripping chain-guiding slot 67. Near the top of the plate 60 and parallel with the slot 67 there is provided a corresponding upper stripping chain-guiding slot 68. Between the slots 67 and 68, there is provided a plurality of lower tool and follower chain-guiding members 69, 70 and 71, and a plurality of upper tool and follower chain-guiding members 72, 73 and 74.

The top surface of the member 69 and the bottom surface of the member 70 are sloped downwardly toward their midpoint in a direction toward the strip or leadframe being processed for lowering the members of the tool chain 22 as explained below. The upper surfaces of the members 70, 72, 73 and 74 are typically flat, smooth surfaces having a constant distance from the leadframe or strip being processed for supporting the tool and follower chains.

The holes 61, 62, 63 and 64 are provided for slidably receiving a plurality of shafts 80, 81, 82 and 83. Shaft 80 is provided for fitting through the hole 61 in the plate 60 and a hole 84 in the drive wheel 33, a hole 85 in one end of the recirculating bridge assembly 41 and a hole 86 in the drive wheel 32. A pair of key members 87 and 88 on the shaft 80 are provided for engaging a pair of keyways 89 and 90 in the drive wheels 33 and 32, respectively. The shaft 81 is provided for fitting through the hole 62 in the plate 60, a hole 92 in the drive wheel 25, a hole 93 in the idler wheel 31, a hole 94 in one end of the recirculating bridge assembly 40, a hole provided therefor in the idler wheel 30 and a hole 95 provided therefor in the drive wheel 24. A pair of key members 96 and 97 are provided on the shaft 81 for engaging corresponding key ways 98 and 99 in the drive wheels 25 and 24, respectively. The idler wheels 30 and 31 are permitted to freely rotate on the shaft 81.

The shaft 82 is provided for fitting into the hole 63 in the plate 60, a hole provided therefor in the idler wheel 35, a hole 100 in the opposite end of the recirculating bridge assembly 41 and a hole 101 in the idler wheel 34. Both of the idler wheels 34 and 35 are permitted to freely rotate on the shaft 82. The bridge 41 is thus supported by the shafts 80 and 82.

The shaft 83 is provided for fitting through the hole 64 in the rear track plate 60 and through a hole 102 in the idler wheel 27, a hole 103 in the drive wheel 29, a hole 104 in the opposite end of the recirculating bridge assembly 40, a hole 105 in the drive wheel 28, and a hole 106 in the idler wheel 26. A pair of key members 107 and 108 extend from the shaft 83 for engaging corresponding key ways 109 and 110 in the drive wheels 29 and 28, respectively. The bridge 40 is thus supported by the shafts 81 and 83.

Mounted to the shaft 80 there is provided a drive gear 115. Mounted to the shaft 83 there is provided a drive gear 117. The drive gears 116 and 117 are coupled by an intermediate gear 118. The shaft 81 is further provided with an internal spline 81a for receiving a splined drive shaft 119, coupled to a motor or other drive means (not shown). All of the shafts and gears described above are supported from a gear-and-shaft-supporting plate 120.

Between the slots 66 and 67 in the rear track plate 60 there is provided a plurality of holes 121. In communication with the holes 121 there is provided an elongated hole 122 extending perpendicularly therefrom.

In the recirculating bridge assembly 40 there is provided a plurality of roller bearing members 125. In the recirculating bridge assembly 41 there is provided a plurality of roller bearing members 126. Roller bearing members 125 and 126 are permitted to recirculate in the assemblies 40 and 41 in tracks provided therefor for applying pressure to the follower chain 22 and for supporting the die chain 23, as will be described in further detail below.

Referring to FIGS. 5-9, there is provided in the die chain 23, a plurality of die chase members 130. In each of die chase members 130 there is provided an insert 131. In the insert 131 there is provided a pair of guide pin receiving holes 132 and 133, a pair of pilot pin receiving holes 134 and 135 and a plurality of tool-receiving and material discharge holes 136. Extending perpendicularly from the tool-receiving and material-discharge holes 136 there is provided a plurality of material-discharge holes 137 and 138.

On opposite sides of the die chase members 130 there is provided a pair of hemispherically shaped recesses 140 and 141. Recesses 140 and 141 are provided for receiving a plurality of pin members 150 and 151. At their ends, the pins 150 and 151 are interconnected to like pins 150 and 151 in adjacent die chases 130 by a plurality of overlapping linking members 152 and 153. The pins 150 and 151 and the linking members 152 and 153 connect the individual die chase members 130 into the flexible endless chain 23.

Also coupled to the ends of the pin members 150 and 151 there is provided a rotatable bearing member 154. The bearing member 154 on the ends of each of the pins 150 and 151 is provided for rotatable movement in the slots 65 and 66 in the rear track plate 60 and the corresponding front track plate (not shown).

Below the recesses 140, 141, there is provided a second pair of recesses 160 and 161. Recesses 160 and 162 are provided for engaging the plurality of rounded teeth 32a and 33a spaced equidistantly about the periphery of the drive wheels 32 and 33 and the idler wheels 34 and 35. Additionally, the surface of the wheels 32-35 between each of the teeth 32a and 33a is typically flat to conform to the flat bottom surface 166 of the die chases 130.

In the stripping chain 20 there is provided a plurality of stripping chase members 170. In each of the stripping chase members 170 there is provided a stripping insert 171. On opposite sides of each of the stripping chase members 170 there is provided a pair of pin-shaped recesses 172 and 173. The recesses 172 and 173 are provided for receiving a plurality of pin members 174 and 175. Fitted to the ends of the pins 174 and 175 there is provided a plurality of overlapping connecting linking members 176 and 177. The pins 174 and 175 and linking members 176 and 177 connect the individual stripping chase members 170 into the flexible endless chain 20. Exterior of the linking members 176 and 177, and rotatably coupled to the ends of the pins 174 and 175, there is also provided a pair of bearing members 178. Bearing members 178 are provided for supporting and guiding the stripping chain 20 in the slots 67 and 68 in the rear track plate 60 and a corresponding front track plate (not shown).

Extending through each of the stripper chase members 170 and the insert 171 there is provided a plurality of holes for receiving a pair of guide pin members 180 and 181, a pair of pilot pin members 182 and 183 and a plurality of tool members 184.

As identified above, the holes 132 and 133 in the insert 131 in each of the die chase members 130 are provided for receiving the lower ends of the guide pins 180 and 181, respectively. The holes 134 and 135, which are provided in the insert 131 of the die chase members 130, are provided for receiving the ends of guide pins 182 and 183, respectively. Similarly, the holes 136 in the inserts 131 of die chase member 130 are provided for receiving the ends of the tool members 184.

There is further provided in the stripping members 170, along their upper edge parallel to the recesses 172 and 173, a pair of curved recesses 195 and 196. The recesses 195 and 196 are provided for receiving the bosses or teeth 24a, 25a, 26a and 27a on the drive wheels 24 and 25 and the idler wheels 26 and 27, respectively.

Referring to the tool chain 21, the upper ends of the guide pins 180 and 181, the pilot pins 182 and 183 and the tool members 184 are removably held in each of a plurality of tool holder members 190 in the tool chain 21. Extending through the center of each of the tool holder members 190 there is provided a pin 191. The pin 191 is provided for engaging a recess 192 provided therefor in the upper end of each of the tool members 184 for retaining the tool members 184 in the tool holders 190. The ends of the pins 191 are also provided for rotatably retaining a bearing member 193. The bearing member 193 is provided for operating in the curved track provided by the curved surfaces between the members 69 and 70 in the rear track plate 60 and a corresponding front track plate (not shown). The curved track between the members 69 and 70 is provided for reducing the distance of the tool holder and tools attached thereto from the strip being processed during processing of the strip, as will be further described below.

Figures 5, 6, 7, 8:
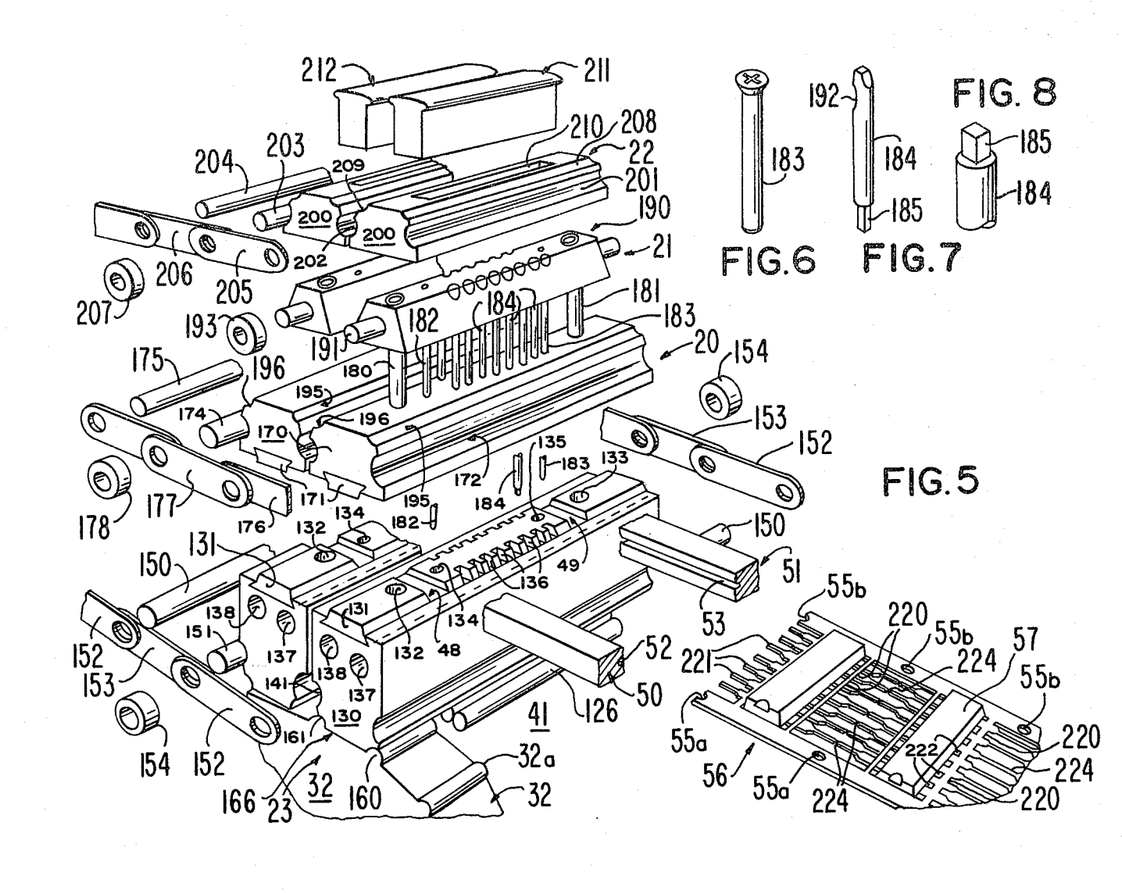
FIG. 5 is a perspective exploded view of a pair of die, stripping, tool and roller follower assemblies in the cassette of FIG. 2.
FIG. 6 is an enlarged view of a pilot pin used in the assemblies of FIG. 5.
FIG. 7 is an enlarged view of a punch tool useable in the assemblies of FIG. 5.
FIG. 8 is an enlarged view of the punch portion of the tool of FIG. 7.

Referring to FIG. 8, the tool 184 is shown in an inverted position for showing an end 185, having a generally rectangular cross section. The tool 184, as shown in FIG. 8, is the type of tool used in station 1 for deflashing—that is, for removing excess plastic from the leadframe. In stations 5 and 6, different tools are employed for removing the dam bar, for cutting the leads and for bending the leads with corresponding changes being made to the stripper chase inserts 171 and the die chase inserts 131 as required.

It may be noted that, while a bearing 193 is fitted to the ends of the pins 191, the tool holders 190 are not interconnected by linking members, as described above with respect to the stripping members 170 and the die members 130. This is because the linking function is provided by an extension of the lower end of the guide pins 180 and 181, the pilot pins 182 and 183 and the tool members 184 into the holes provided therefor in the stripping members 170. This arrangement provides for maintaining the tool holders 190 in their appropriate relative positions forming the tool chain 21 without the need for linking members.

In the follower chain 22 there is provided a plurality of follower carrier members 200. In each of the follower carrier members 200 there is provided, on opposite sides thereof, a pair of pin-shaped recesses 201 and 202. The recesses 201 and 202 are provided for movably receiving a plurality of pins 203 and 204. The ends of the pins 203 and 204 are interconnected by a plurality of overlapping members 205 and 206. Linking members 205 and 206 are provided for interconnecting the pins 203 and 204 to form the follower chain 22. On the ends of the pins 203 and 204 there is further provided a bearing member 207. Bearing member 207 is provided for guiding the follower chain 22 in the track formed by the members 70 and 71 and the members 72 and 73 in the rear track plate 60 and a corresponding front track plate (not shown).

Along the upper edge of the carrier follower members 200 there is provided a second pair of curved recesses 208 and 209. Recesses 208 and 209 are provided for receiving the bosses or teeth 28a, 29a, 30a and 31a on the drive wheels 28 and 29 and the idler wheels 30 and 31, respectively.

Centrally located in each of the carrier members 200 there is provided a rectangular hole 210. Hole 210 is provided for receiving a roller follower 211. Each of the roller followers 211 are generally rectangular in a horizontal cross section, have a T-shape in a transverse cross section with a curved upper surface 212 and slide freely up and down in the hole 210. The curved upper surface 212 is provided for receiving the roller bearing members 125 in the bridge 40, described above with respect to FIG. 4.

Figure 10:
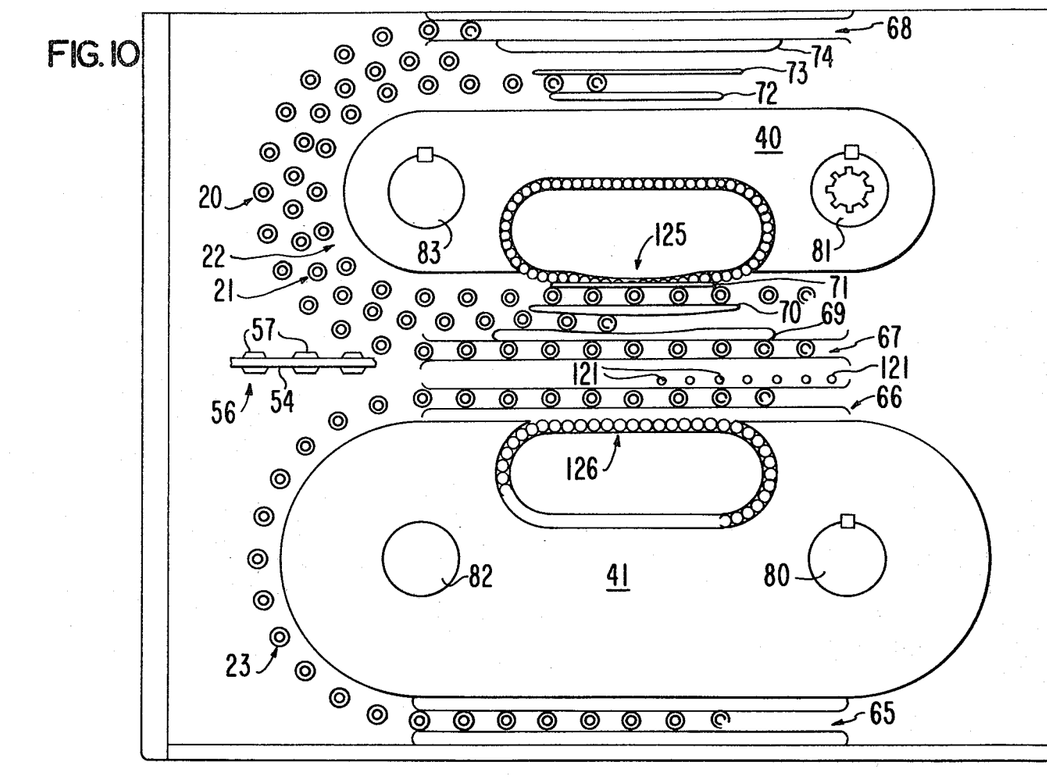
FIG. 10 is a side view of one of the track plates and the interaction of the bearing members of the die, stripping, tool and roller follower assemblies associated therewith according to the present invention.

Referring to FIG. 10, there is shown a side view of the interior of the rear track plate 10 and the paths of travel of the stripper chain 20, the tool chain 21, the carrier follower chain 22 and the die chain 23.

In operation, as the integrated circuit package and leadframe 56 are inserted between the stripper chain 20 and the die chain 23 by the input section 3, the integrated circuit package and leadframe are captured between the two chains 20 and 23 and towed along by the movement of the chains in a recirculating fashion. As the packages and leadframe are towed, the pilot pins 181 and 182 engage holes 55a and 55b in the edges 54 and 55 of the leadframe 56. (See FIG. 5.) The pilot pins insure that the leadframe is properly positioned during processing. As the tool holders 170 in the chain 21 reach the left edge of the guiding members 69 and 70, the downward slope of the guiding members 69 and 70 cause each of the tool holders 170 to be forced downwardly. At the same time, the upper surface 212 of the carrier followers 211 in the carrier follower chain 22 engage the roller bearing 125 in the bridge 40. As the carrier followers 211 engage the roller bearings 125, the carrier followers 211 are forced down against the tool holders 190 in the chain 21, causing the individual tools 184 in the tool holders 190 to penetrate the selected portions of the packages and leadframe 56. In station 4 the tools are adapted to deflash the excess plastic from the leadframe packages 57.

Referring to FIG. 5, and the leadframe 56 shown therein, there is shown a dam bar 220 extending across the leadframe interconnecting the leads of the leadframe 221 on opposite sides of the integrated circuit packages 57. Between the dam bars 220 and the package 57 there is a rectangular space 222. It is in the space 222 that the deflashing process occurs to remove therefrom excess plastic which is formed in the formation of the plastic package 57 between the package 57 and the dam bar 220.

Figure 9:
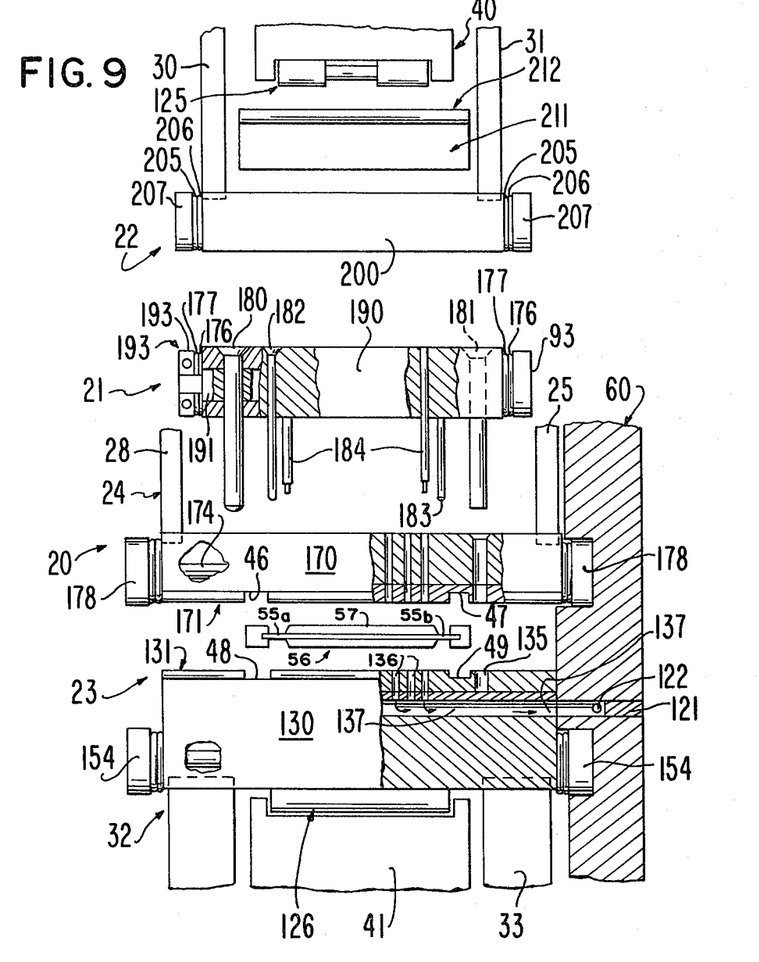
FIG. 9 is an exploded cross-sectional view of one of the die, stripping, tool and roller follower assemblies of FIG. 5 with a partial view of the bridges of FIG. 3.

After the excess material is removed from the packages 57 during the deflashing process, the severed material is forced through the holes 136 in the individual die chase inserts 131 and pulled from the die chases through holes 121 and the manifold hole 122 by a vacuum, as shown more clearly by the arrows in FIG. 9.

After the deflashing operation is completed, the upward slope of the surfaces on the tracking members 69 and 70 raise the tool holders 190 in the chain 21 to remove the tool from the underlying die chain 23 and the integrated circuit package and leadframe 56. As the tools 184 are being removed from the integrated circuit package and leadframe 56, the stripping chain 20 restricts any upward movement of the integrated circuit package and leadframe 56.

At the same time that the tool holder 190 is being forced downwardly by the downwardly curved surfaces of the members 69 and 70, a corresponding downwardly curved path for the roller bearings 125 in the bridge 140 forces the carrier follower to press downwardly on the tool holder to provide the necessary forces for penetrating the leadframe and integrated circuit package parts. Correspondingly, as the surfaces on the members 69 and 70 slope upwardly, there is a corresponding upward slope in the path of travel of the roller bearings 125 so as to remove the pressure from the tool chain 21.

As the integrated circuit package and leadframe 56 exits from between the stripper chain 20 and die chain 23, it is fed into the next station for subsequent processing.

As previously described, the next step in processing involves removal of the dam bar 220 from between the leads 221. This requires the use of a slightly different tool and, of course, the placement of the tool is shifted from the position of the tools 184 used in deflashing the integrated circuit package and leadframe 56 to sever the dam bar 220 from between the leads 221. In all other respects the individual parts in station 5 and their operation are substantially identical as described above with respect to station 4.

Similarly, in station 6 the tools used are adapted to sever the leads 221 at their midpoint between adjacent packages 57 at a point 224 intermediate the packages 57. (See FIG. 5.) After the leadframes are severed at the points 224, they are bent downwardly by appropriate tool members in the tool chain 21. Again, in all other respects the parts of station 6 are substantially identical to those described above with respect to stations 4 and 5.

In the exit station 7, the edges of the leadframe 54 and 55 are removed from the integrated circuit package and leadframe 56 in a conventional manner and the individual integrated circuit packages 57 and their associated leads, now bent into the desired figuration, are deposited in a carrier for transportation to another location for subsequent processing and/or testing.

As shown in FIG. 1, each of the processing stations 4, 5 and 6 are removable cassette which are held in the housing 2 by conventional latching members (not shown). To remove a cassette for repair or replacement, it is a relatively simple matter to release the cassette by releasing the latching members and slipping the cassette off of the splined shaft 119, while removing the cassette from the housing 2. This only takes a few minutes and greatly reduces "down time."

While a preferred embodiment of the present invention is described and the modifications for tool stations 5 and 6 necessary for the performance of their processing functions are discussed, it is contemplated and understood that still other modifications may be made to the apparatus to perform still other processing steps without departing substantially from the scope of the present invention. Accordingly, it is intended that the scope of the present invention not be limited to the embodiments described but be determined by reference to claims herafter provided and their equivalents.

What is claimed is:

1. An apparatus for processing a strip of material comprising:
   a plurality of tool means interconnected in an endless chain, for shaping predetermined parts of said strip of material;
   a plurality of follower means interconnected in an endless chain, for forcing said tool means against said predetermined parts of said strip of material;
   a plurality of die means interconnected in an endless chain which cooperate with said tool means, for shaping said predetermined parts of said strip of material;
   a plurality of stripping means interconnected in an endless chain for stripping said strip of material from said tool means after said shaping of said strip of material by said tool and die means;
   means for transporting said strip of material between said stripping means and said die means; and
   means for moving said tool, said follower, said stripping and said die means in a recirculating fashion relative to said strip of material as said strip of material is being transported therebetween.

2. An apparatus according to claim 1 wherein each of said plurality of tool means comprises:
   a tool holder;
   means disposed in said tool holder for movably receiving a tool member, said tool member having a surface for providing said shaping of one of said predetermined parts of said strip of material;
   means for controlling the position of said tool holder relative to said strip of material during the time said tool member is shaping said predetermined part of said strip of material; and
   means for slidably coupling said tool holder to said stripping means.

3. An apparatus according to claim 1 wherein each of said plurality of follower means comprises:
   a roller follower carrier;
   means disposed in said roller follower carrier for movably receiving a roller follower, said roller follower having a first surface for engaging said tool means and a second surface for transmitting an applied force to said tool means;
   means for controlling the position of said roller follower carrier relative to said strip of material during the time said roller follower means is forcing said tool means against said predetermined parts of said strip of material; and
   means for interconnecting said roller follower carrier to another one of said roller follower carriers in said plurality of follower means; and wherein said apparatus comprises means for applying a force on said second surface of said roller follower.

4. An apparatus according to claim 1 wherein each of said plurality of die means comprises:
   a die chase;
   means disposed in said die chase for removably retaining a die insert; and
   means for interconnecting said die chase to another one of said die chases in said plurality of die means; and wherein said die means comprises means for supporting said die chase during the time said die means is cooperating with said tool means for shaping said predetermined parts of said strip of material.

5. An apparatus according to claim 1, wherein each of said plurality of stripping means comprises:
   a stripper chase;
   means disposed in said stripper chase for removably retaining a stripper insert; and
   means for interconnecting said stripper chase to another one of said stripper chases in said plurality of stripping means.

6. An apparatus according to claim 1 wherein said strip transporting means comprises:
   guide means for guiding said strip of material between said stripping and die means; and
   means for engaging said strip of material.

7. An apparatus according to claim 1 wherein said means for moving said tool, said follower, said stripping and said die means in a recirculating fashion comprises:
   a first pair of drive wheels and a first pair of idler wheels for engaging said follower means;

a second pair of drive wheels and a second pair of idler wheels for engaging said stripping means;

means for coupling said tool means and said stripping means;

a third pair of drive wheels and a third pair of idler wheels for engaging said die means; and means coupled to said first, said second and said third pairs of drive wheels for driving said drive wheels.

8. An apparatus according to claim 2 wherein said tool member comprises a plurality of elongated pin-like members which extend through holes provided therefor in said stripping means.

9. An apparatus according to claim 2 wherein said means for controlling the position of said tool holder relative to said strip of material comprises means for engaging a guiding surface in said apparatus which guides said tool holder in a direction toward said strip of material during said shaping of said predetermined parts of said strip.

10. An apparatus according to claim 2 wherein said means for slidably coupling said tool holder to said stripping means comprises pin means extending from said tool holder and hole means in said stripping means for slidably receiving said pin means.

11. An apparatus according to claim 2 wherein said tool member comprises means for bending said predetermined parts of said strip.

12. An apparatus according to claim 2 wherein said tool member comprises means for severing material from said predetermined parts of said strip and said tool holder comprises means for discharging said material severed from said strip during said shaping of said predetermined parts of said strip.

13. An apparatus according to claim 3 wherein said roller follower carrier and said roller follower comprise means for minimizing the application of lateral forces to said tool means during said shaping of said predetermined parts of said strip.

14. An apparatus according to claim 3 wherein said means for controlling the position of said roller follower carrier relative to said strip of material comprises means for engaging a guiding surface in said apparatus which maintains said roller follower carrier at a predetermined distance from said strip during the time said roller follower means is forcing said tool means against said predetermined parts of said strip of material.

15. An apparatus according to claim 3 wherein said means for interconnecting said roller follower carriers comprises a plurality of pin members, a pair of pin-receiving recesses in opposite sides of each of said roller follower carriers for receiving a pair of said pin members; and connecting link means for interconnecting said pin members associated with one of said roller follower carriers with the pin members associated with an adjacent one of said roller follower carriers.

16. An apparatus according to claim 3 wherein said force-applying means comprises a roller bearing assembly comprising a plurality of roller bearings for engaging said second surface of said roller follower.

17. An apparatus according to claim 4 wherein said means for interconnecting said die chases comprises:
a plurality of pin members;
a pair of pin-receiving recesses in opposite sides of said die chases for receiving a pair of said pin members; and
connecting link means for interconnecting said pin members associated with one of said die chases with the pin members associated with an adjacent one of said die chases.

18. An apparatus according to claim 5 wherein said means for interconnecting said stripper chases comprises:
a plurality of pin members;
a pair of pin-receiving recesses in opposite sides of each of said stripper chases for receiving a pair of said pin members; and
connecting link means for interconnecting said pin members associated with one of said stripper chases with the pin members associated with an adjacent one of said stripper chases.

19. An apparatus according to claim 6 wherein said strip of material comprises a pair of lateral edges extending along the length thereof and said guiding means comprises means for engaging said lateral edges.

20. An apparatus according to claim 6 wherein said strip-engaging means comprises means for engaging holes spaced along the lateral edges of said strip.

21. An apparatus according to claim 12 wherein said discharging means comprises a hole for receiving said severed material and said apparatus comprises means for removing material severed from said strip from said hole by means of a vacuum.

22. An apparatus according to claim 20 wherein said hole-engaging means comprises pin means which extend through said holes between said stripping and die means.

* * * * *